United States Patent [19]
Riley

[11] Patent Number: 4,965,531
[45] Date of Patent: Oct. 23, 1990

[54] FREQUENCY SYNTHESIZERS HAVING DIVIDING RATIO CONTROLLED BY SIGMA-DELTA MODULATOR

[75] Inventor: Thomas A. D. Riley, Osgoode, Canada

[73] Assignee: Carleton University, Ottawa, Canada

[21] Appl. No.: 439,662

[22] Filed: Nov. 22, 1989

[51] Int. Cl.⁵ .................... H03L 7/197; H03K 21/02
[52] U.S. Cl. .................... 331/1 A; 328/14; 328/25; 331/16; 331/25; 377/48
[58] Field of Search .................... 331/1 A, 16, 25; 328/14, 25, 155; 377/48; 332/127

[56] References Cited

U.S. PATENT DOCUMENTS

| | | | |
|---|---|---|---|
| 4,410,954 | 10/1983 | Wheatley, III | 364/701 |
| 4,559,613 | 12/1985 | Murphy et al. | 377/48 X |
| 4,652,832 | 3/1987 | Jasper | 328/14 |
| 4,856,032 | 8/1989 | Klekotka et al. | 331/1 A X |

FOREIGN PATENT DOCUMENTS

| | | | |
|---|---|---|---|
| 1173515 | 8/1984 | Canada | 328/10 |
| 89/06009 | 6/1989 | PCT Int'l Appl. | |

OTHER PUBLICATIONS

"A Use of Double Integration in Sigma Delta Modulation", by James C. Candy, IEEE Transactions on Communications, vol. COM-33, No. 3, Mar. 1985, pp. 249-258.

*Primary Examiner*—Siegfreid H. Grimm
*Attorney, Agent, or Firm*—Foley & Lardner, Schwartz, Jeffery, Schwaab, Mack, Blumenthal & Evans

[57] ABSTRACT

An indirect frequency synthesizer suitable for use in a cellular radio system has finer resolution and reduced spurious frequencies and/or phase noise, which facilitates a large number of channels in a given bandwidth. The synthesizer comprises a phase detector responsive to a reference signal and a phase control signal for generating a control signal that varies in dependence upon the phase difference between the reference signal and the phase control signal. A voltage controlled oscillator responsive to the control signal generates an output signal whose frequency varies in dependence upon the control signal. A variable modulus divider divides the output signal to provide the phase control signal. The variable modulus divider varies its division ratio in dependence upon a ratio control signal derived by a second or higher order sigma-delta modulator in response to a frequency control signal δϕ and to the phase control signal. The sigma-delta modulator displaces any quantization noise in the ratio control signal away from the frequency of the phase control signal and multiplies thereof. A direct frequency synthesizer may be implemented by means of the same sigma-delta modulator and variable modulus divider, but arranged so that the reference frequency signal is applied to the input of the divider, which divides it directly to provide the desired output frequency.

21 Claims, 5 Drawing Sheets

FREQUENCY SYNTHESIZERS HAVING DIVIDING RATIO CONTROLLED BY SIGMA-DELTA MODULATOR

FIELD OF THE INVENTION

This invention relates to frequency synthesis and is especially, but not exclusively, applicable to frequency synthesizers such as are used in radio systems, for example cellular radio systems.

BACKGROUND

Generally, such frequency synthesizers use a reference frequency as a source and synthesize from it a desired output frequency as a multiple (in the case of an indirect synthesizer) or quotient (in the case of a direct synthesizer) of the reference frequency. The ratio between the output frequency and the reference frequency is determined by a control signal which may be analog or digital depending upon the implementation preferred.

In a typical direct frequency synthesizer, the input reference frequency is much higher than the frequency to be synthesized and is divided directly to provide an output signal of the required frequency. A low pass filter reduces quantization noise in this output signal. One disadvantage of the direct frequency synthesizer is that the reference has to be at a much higher frequency than the output, which makes it unsuitable for applications such as cellular radio, where the output frequency is near the limits of the fabrication technology. Another disadvantage is that in some cases a high resolution digital-to-analog converter is required, which presents a substantial technical problem if the frequency synthesizer is to be fabricated as an integrated circuit.

In a typical indirect frequency synthesizer, the division takes place in a feedback path. The frequency of the input reference signal is approximately equal to that of the divided signal. The signal which is actually divided is the required output signal, which is thus the highest signal which needs to be generated in the circuit. Hence, the indirect frequency synthesizer is preferred for applications such as cellular radio.

In both direct and indirect frequency synthesizers, quantization produces spurious frequencies and/or phase noise which may appear in the output signal and present a problem. In synthesizers which employ a sine look-up table, the analog-to-digital converter generates spectral peaks at several predictable frequencies, the energy level of these spectral peaks being dependent upon the resolution of the digital-to-analog converter. The greater the number of input bits to the digital-to-analog converter, the greater the difference between the spurious frequencies and/or phase noise and the output at the fundamental frequency.

Increasing the resolution of the digital-to-analog converter will decrease the spurious frequencies and/or phase noise but this technique is not preferred since the concomitant increase in complexity of the digital-to-analog converter results in slower operating speed, increased power consumption, lower reliability and higher implementation costs.

Another approach, exemplified by Canadian patent No. 1,173,515, which is incorporated herein by reference, is to cancel phase error each cycle. Unfortunately, this approach still requires a digital-to-analog converter and also involves precise matching between the digital value of the phase error stored in a phase register and a time delay at the output of a voltage-control pulse delay.

Various other techniques have been employed to reduce the quantization noise in frequency synthesizers. For example, U.S. Pat. No. 4,652,832, issued to Steven C. Jasper, which is incorporated herein by reference, discloses a frequency synthesizer in which a digital dither signal is applied to the output of a phase accumulator before conversion into sine and cosine data through look-up tables. Although this may give an increase in resolution at the intermediate stage, it does not eliminate the effects of quantization error at the digital-to-analog conversion stage.

U.S. Pat. No. 4,410,954, issued to Charles Wheatley III, which is incorporated herein by reference, discloses a frequency synthesizer in which a phase accumulator is used as a direct digital integrator, eliminating the usual sine amplitude look-up table and the digital-to-analog converter. A dither signal applied to either the input or the output of the accumulator varies the phase vectors in small steps that are less than the minimum phase step. This approach increases frequency resolution and reduces noise but unfortunately is not entirely satisfactory because the dither signal introduces random or pseudorandom noise thorughout the spectrum and hence at the desired output frequency and its multiples. Also, its ability to achieve high frequency resolution through the use of advanced sine amplitude conversion techniques is limited.

WIPO patent application No. 89/06009, published Jun. 29, 1989, discusses direct frequency synthesizers (DDS) for frequency hopping and multi-channel systems which comprise a digital phase accumulator, a periodic wave function conversion element in the form of a read-only memory (ROM) device, and a digital-to-analog converter. The phase accumulator increments a phase angle which is converted into an analog waveform by a conversion element. The instantaneous amplitudes at given points during the period of the sine function are computed as digital values from the accumulated phase then transferred to the digital-to-analog converter for conversion to an analog signal having the same frequency as the phase angle data. The digital-to-analog conversion introduces spurious frequencies and/or phase noise due to quantization. These spurious frequencies and/or phase noise are distributed throughout the frequency spectrum by generating a series of randomly- or pseudorandomly-varying numbers, adding one to each of the sine amplitude numbers, truncating the addend, and applying it to the digital-to-analog converter. The random of pseudorandom numbers are generally scaled to a predetermined amplitude before being added to the sine amplitude numbers. This approach is not entirely satisfactory for cellular radio systems because an unacceptable level of noise is still present in the vicinity of the operating frequency unless many bits are employed in the digital-to-analog converter, with disadvantages as discussed above.

As the number of users in a cellular radio system increases, a large number of communications channels are needed within an allotted bandwidth, so the separation between channels must be less. This results in a need for finer frequency resolution, so the reference or mixing frequency for each channel must be derived more accurately and spurious frequencies and/or phase noise must be minimized.

SUMMARY OF THE INVENTION

According to one aspect of the present invention, an indirect frequency synthesizer comprises:

detector means, for example a phase detector (110), responsive to a reference signal and a phase control signal ($f_d$) for generating a control signal that varies in dependence upon the phase difference between said reference signal and said phase control signal;

low pass filter means connected to the output of said phase detector means for filtering said control signal;

means, for example a voltage-controlled oscillator (118), responsive to said control signal for generating an output signal ($f_o$) whose frequency varies in dependence upon said control signal;

means (106) for dividing said output signal ($f_o$) to provide said phase control signal, said dividing means having a control input and being operative to vary its division ratio in dependence upon a ratio control signal (b{t}) applied to said control input; and second or higher order sigma-delta modulator means (102) responsive to a frequency control signal ($\delta\phi$) and to said phase control signal ($f_d$) to provide said ratio control signal, the second or higher order sigma-delta modulator means (102) being arranged to displace any quantization noise in said ratio control signal away from the frequency of said phase control signal ($f_d$) and multiples thereof.

Consequently, the mixing action of the detector means heterodynes (frequency-translates) the phase control signal ($f_d$) and its multiples to d.c. Substantially all of the quantization noise remaining after the heterodyning will then be at frequencies above the cut-off point of the low pass filter means.

According to another aspect of the invention, a direct frequency synthesizer comprises:

variable modulus divider means (106) for dividing a signal having a reference frequency ($f_r$) to provide an output signal of a desired frequency ($f_{od}$), the ratio of such division being variable in dependence upon a ratio control signal (b{t}), and;

second or higher order sigma-delta modulator means (102) responsive to a frequency control signal ($\delta\phi$) and to the output ($f_{od}$) of said divider means (106) for supplying a said ratio control signal (b{t}) in which any quantization noise is displaced away from the frequency of said output signal and multiples thereof.

SPECIFIC DESCRIPTION OF A PREFERRED EMBODIMENT

Figure 1:
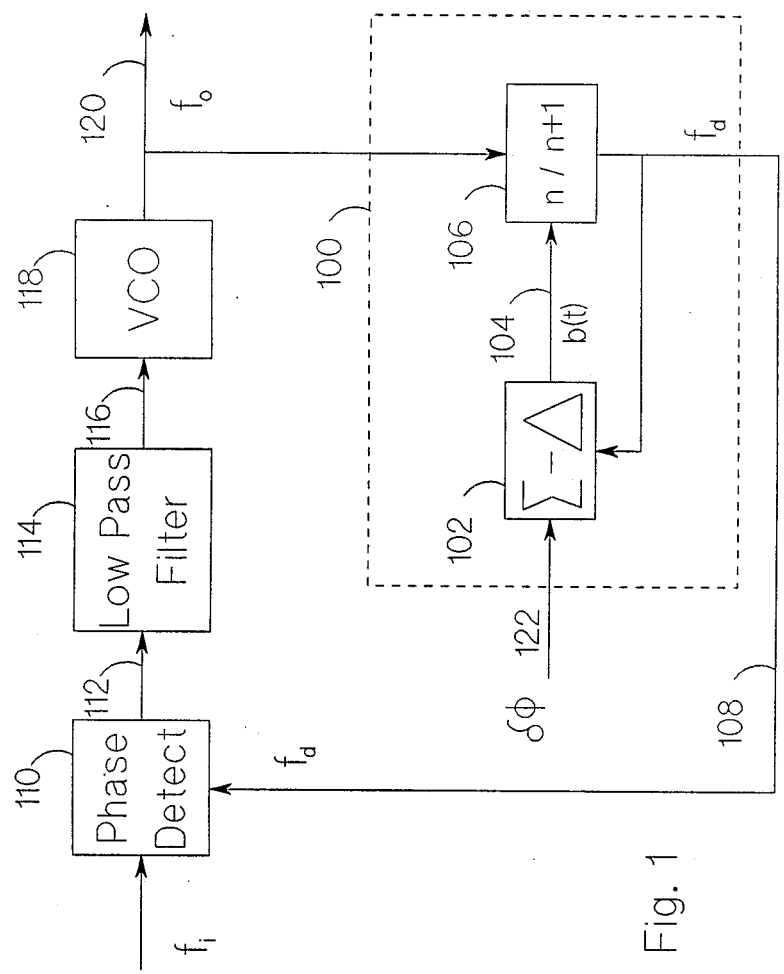
FIG. 1 is a block schematic diagram of a first embodiment of the invention comprising an indirect frequency synthesizer employing a sigma-delta modulator.

FIG. 1 shows an indirect frequency synthesizer for synthesizing an output signal $f_o$, having a frequency of 89.1 MHz, from an input reference signal $f_i$, having a frequency of 2.2 MHz. The synthesizer comprises a feedback loop which includes a fractional-N divider 100 for dividing the output signal $f_o$ to provide a phase control signal $f_d$, which also is about 2.2 MHz., for comparison with the reference signal $f_i$. The fractional-N divider 100 comprises a sigma-delta modulator 102 which provides, on line 104, a ratio control signal b(t) which controls the ratio of a variable modulus divider 106. The output of the variable modulus divider 106, the phase control signal $f_d$, is applied on line 108 to a phase detector 110 which compares it with the input reference signal $f_i$.

The control signal provided at the output of phase detector 110, on line 112, is a nominally d.c. voltage which is proportional to the phase difference between the reference signal $f_i$ and the phase control signal $f_d$. This control signal is filtered by means of a low pass filter 114 and applied on line 116 to control a voltage controlled oscillator 118 which generates the output frequency $f_o$ on line 120.

The output of the sigma-delta modulator 100, which controls the variable modulus divider 106 to determine the division ratio between the output frequency $f_o$ and the phase control signal $f_d$, (and indirectly reference frequency $f_i$), is itself determined by a control signal $\delta\phi$ applied to the sigma-delta modulator 102 on line 122. The sigma-delta modulator 102 uses, as a clock, the phase control signal $f_d$ from the output of variable modulus divider 106.

The sigma-delta modulator 102 is conveniently of the kind described by James C. Candy in a paper entitled "Use of Double Integration in Sigma Delta Modulation", IEEE Trans. on Communications, Vol. COM-33, No. 3, Mar. 1985, which is incorporated herein by reference. The characteristics of a sigma-delta modulator are such that the quantization noise at its output tends to be towards the high end of the spectrum and hence away from both the DC level of the control voltage $\delta\phi$ and the frequency of phase control signal $f_d$ and its multiples. The way in which the discrete time filtering of the quantization noise occurs is evident from equation 3 on page 251 of the aforementioned paper by Candy.

The sigma-delta modulator 102 acts as a discrete time filter in that its output signal changes at discrete time intervals rather than continuously. In effect, the sigma-delta modulator 102 is an "all pass" filter to the substantially constant control signal $\delta\phi$ and a "high pass" filter to quantization noise. This noise is inherent in the sigma-delta modulator 102. Where an analog sigma-delta modulator is used, the noise will have reduced power spectral density in the vicinity of phase control signal $f_d$ and its multiples. Where a digital sigma-delta modulator is used, reduced spurious frequency components in the vicinity of $f_o$ and its multiples will result from the placement of the zeros of the high pass filter function at d.c., the frequency of phase control signal $f_d$, and its multiples.

Figure 2:
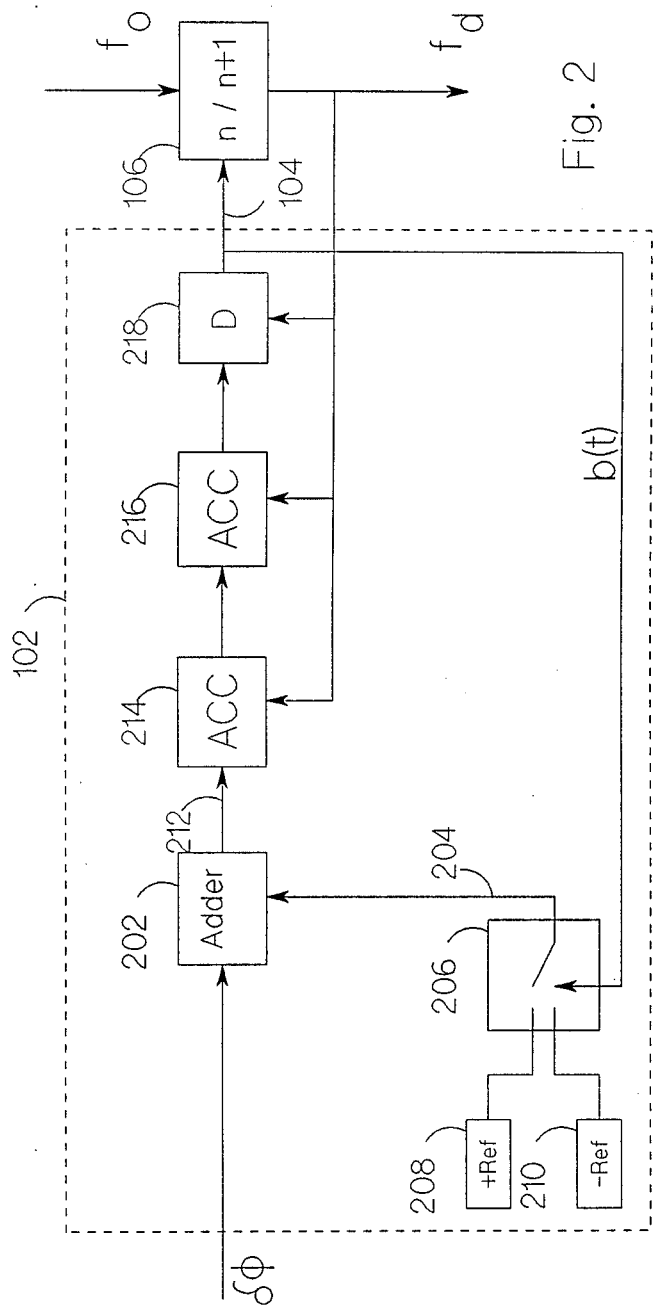
FIG. 2 is a detail diagram of a fractional-N divider of the synthesizer showing the sigma-delta modulator in more detail.

FIG. 2 shows the fractional-N divider 100, comprising the variable modulus divider 106 and a second order sigma-delta modulator 102, the latter being shown in more detail. In a practical embodiment of the invention, the variable modulus divider 106 was implemented using a two modulus programmable divider, part number SP8716, by Plessey Semiconductors Limited. The two modulus programmable divider 106 divides the frequency $f_o$ alternately by "40" and "41", respectively, in dependence upon the state, 1 or 0, of the control signal received on line 104 from the sigma-delta modulator 102. The output of the two modulus programmable divider 102 is thus the phase control signal frequency $f_d$ which is applied via line 108 to the phase detector 110 (FIG. 1).

In the sigma-delta modulator 102, the two's complement control signal $\delta\phi$ is applied to an adder 202. A positive reference signal (+REF) or a negative reference signal (−REF) is applied, on line 204, to a second input of the adder 202 by a selector switch 206. This selector switch 206 selects the positive reference +REF, from source 208, or the negative reference −REF, from source 210, in dependence upon the state of the ratio control signal b(t) from the sigma-delta modulator 102, which is applied to the switch 206 on line 104.

The adder 202 combines the reference signal +REF or the reference −REF with the control signal $\delta\phi$ and applies the aggregate on line 212 to an accumulator 214.

It should be noted that, for satisfactory operation, the signal $\delta\phi$ should be greater then −REF/2 and less than +REF/2. For a 16 bit implementation, REF may, for example, be the number 8192. The frequency control signal $\delta\phi$ has a constant or slowly varying level and the reference signal applied to adder 202 alternates between two constant or slowly varying levels. The input to accumulator 214 is a signed two's complement signal and its output, an unsigned binary number, can go either up or down. In a second accumulator, 216, this unsigned binary number is added to the previously stored value, causing the value stored in accumulator 216 to increase. The overflow output of accumulator 216, comprising a single bit, is stored by delay means or latch 218 until the next cycle of the clock (signal $f_d$), then supplied as the output of the sigma-delta modulator 102 on line 104. (The latch 218 and accumulators 214 and 216,, are all clocked by the signal $f_d$.)

Quantization noise is inherent within the sigma-delta modulator 102 since its output is low resolution, i.e. one bit, and its input is high resolution i.e. the signal $\delta\phi$. As discussed earlier, however, the noise is shifted away from d.c., the frequency of the phase control signal $f_d$ and its multiples, thus ameliorating the problem of spurious frequencies and/or phase noise. Increasing the number of bits in the sigma-delta modulator, or cascading the sigma-delta modulators, permits arbitrarily fine resolution, even though the one-bit output itself constitutes coarse resolution. Whereas a basic phase locked loop, i.e. without the sigma-delta modulator, can only synthesize two frequencies, vis. $f_i \times n$ or $f_i \times (n+1)$, the sigma-delta modulator permits synthesis of substantially any frequency between $f_i \times (n+0.25)$ and $f_i \times (n+0.75)$ providing the sigma-delta modulator has enough bits. Increasing the number of bits increases the resolution of the frequencies which can be synthesized.

Figure 3:
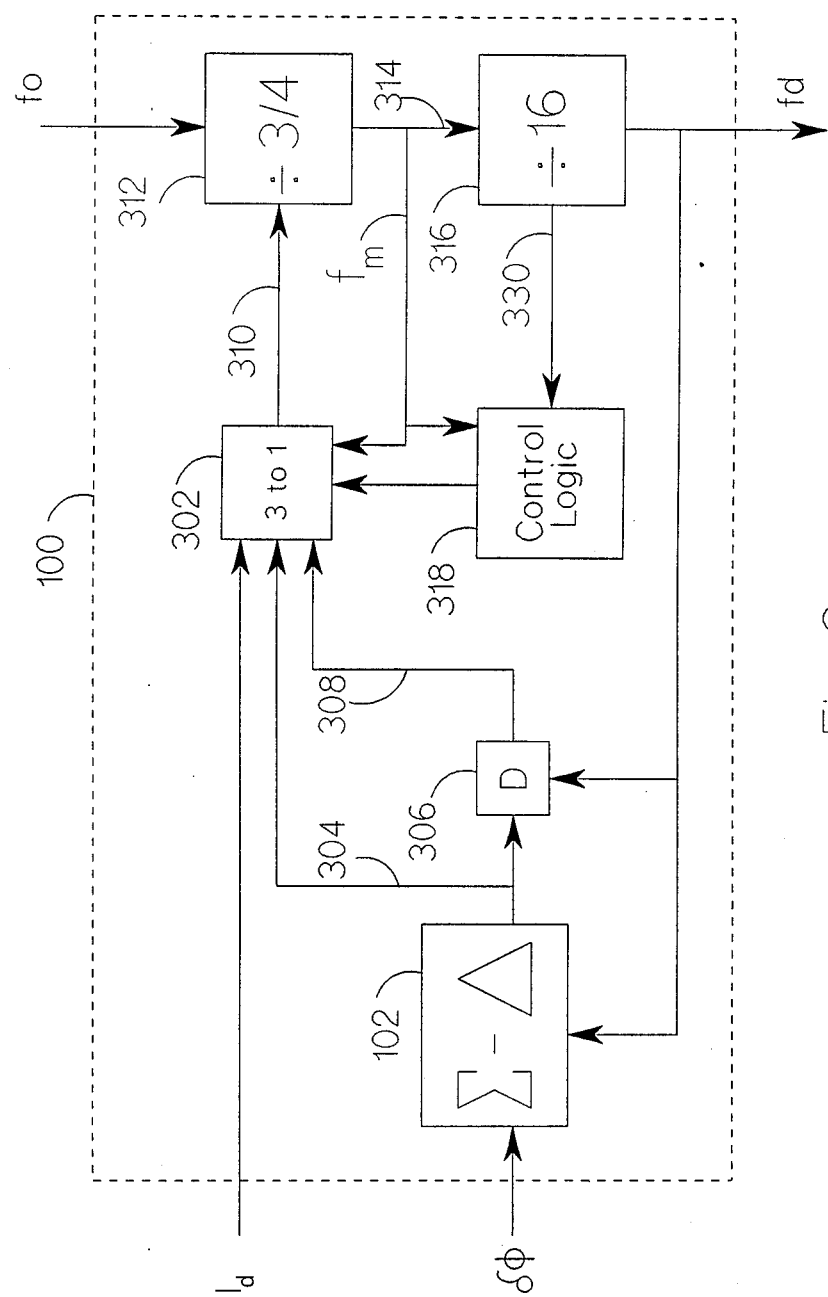
FIG. 3 is a detail diagram corresponding to FIG. 2 but showing a variable modulus divider portion of the fractional-N divider in more detail.

In FIG. 3, an alternative fractional-N divider is shown, comprising a sigma-delta modulator 102, which is the same as in FIG. 1, but with a two stage variable modulus divider. As before, the sigma-delta modulator 102 is controlled by a frequency control signal $\delta\phi$. A second control signal, $I_d$, which comprises a sequence of single bits, is applied to a 3-to-1 multiplexer 302, together with the instant output of the sigma-delta modulator 102 on line 304 and, on line 308, the output of the modulator 102 from the preceding clock period via a one bit delay 306.

The output of the 3-to-1 multiplexer 302, on line 310, controls a divide-by-3 or 4 divider 312, which divides the output signal $f_o$ and applies the resulting signal $f_m$ on line 314 to a divide-by-16 divider 316 which divides it to give the phase control signal $f_d$. The divide-by-16 divider 316 has 16 states, typically represented by 4 bits or 8 bits depending upon how the counter was implemented.

The instantaneous state of divider 316 is applied to control logic 318 which controls the multiplexer 302. The control logic 318 and multiplexer 302 are clocked by the output $f_m$ of divider 312. In a specific practical case $I_d$ comprised 14 ones or zeros, representing the integer portion of the division ratio, and two zeros.

The control logic 318 causes the multiplexer 302 to select one of (i) the second control signal $I_d$; (ii) the direct output of the sigma-delta modulator 102; and (iii) the delayed output of the sigma-delta modulator 102. For the first 14 cycles, signal $I_d$ controls the divide-by-3 or 4 divider 312. On the 15$^{th}$ cycle, the divide-by-3 or 4 divider 312 is controlled by the direct output of the sigma-delta modulator 102 and on the 16$^{th}$ cycle by the output of delay 306. As a result, the variable modulus divider 106 can divide by any number between 49 and 63, with $I_d$ representing the integer portion of the division ratio and $\delta\phi$ representing the fractional portion of the division ratio. The output of divide-by-16 counter 316, the phase control signal $f_d$, serves as a clock for the delay 306.

Figure 4:
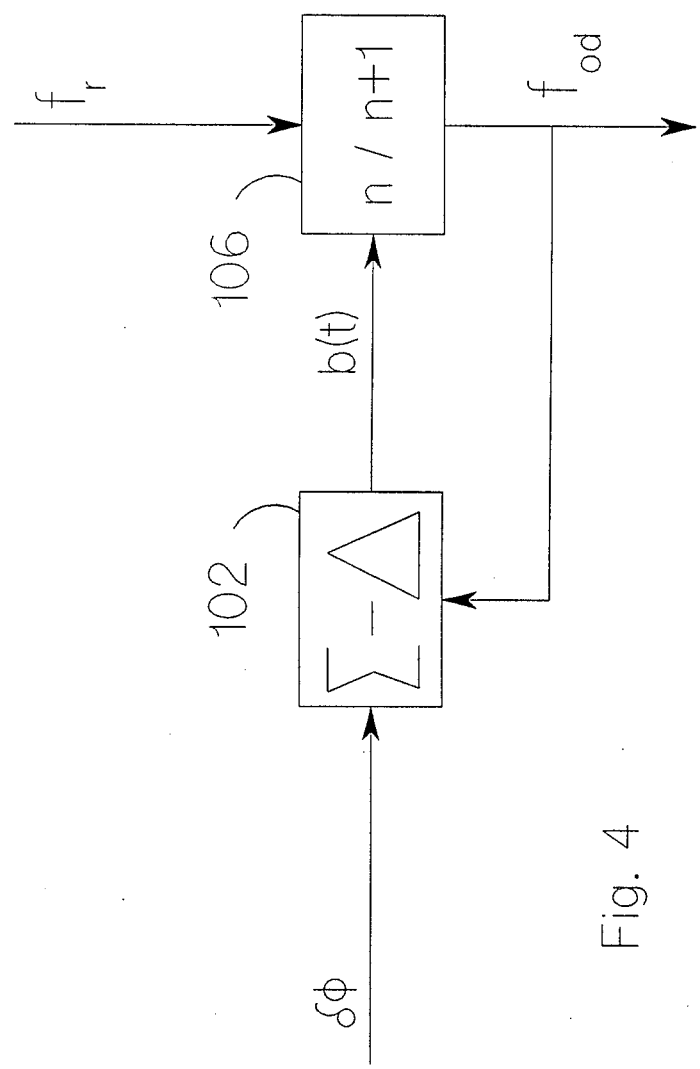
FIG. 4 is a block schematic diagram of a direct frequency synthesizer embodying the invention.

Although the foregoing specific description is of an indirect frequency synthesizer, the invention is also applicable to direct synthesizers. Such a direct frequency synthesizer is illustrated in FIG. 4 and comprises a sigma-delta modulator 102 and a variable modulus divider 106 which may be of similar construction to those described with reference to FIGS. 1, 2 and 3. A reference frequency $f_r$ is applied to the variable modulus divider 106, the output of which is the output signal $f_{od}$ at the desired frequency. The frequency of the reference signal $f_r$ is much higher than that of the output signal $f_{od}$. The division ratio is controlled, as before, by a control signal $\delta\phi$ applied to the sigma-delta modulator 102.

Alternatively, the division ratio may be controlled by changing the values +REF and −REF in the sigma-delta modulator 102. Since the division ratio is proportional to $\delta\phi$/REF, the frequency of the output signal $f_{od}$ varies linearly with REF. Consequently, changing the reference by fixed increments will change the output frequency $f_{od}$ in linear increments.

In essence, the direct frequency synthesizer corresponds to the fractional-N divider 100 i.e. the frequency synthesizer of FIG. 1 without the phase detector 110, filter 114 and voltage controlled oscillator 118.

It should be appreciated that the fractional-N divider described with reference to FIG. 3 could be used for either the direct synthesizer or the indirect synthesizer.

To act as a good pseudo-random number generator (PN), an all-digital sigma-delta modulator must be capable of producing long bit sequences. The length of the sequence is one of several figures of merit for a PN generator and all PN generators have a finite sequence length. However, under certain conditions the second order all digital sigma-delta modulator may not produce a sequence long enough to be of practical use. This condition may be caused by the presence at the input to the sigma-delta modulator of a static signal $\delta\phi$ which has many zeros in the less significant bits of the binary representation of $\delta\phi$. For example, in sigma-delta modulator 102, if $\delta\phi$ were a "round" binary number, such as 2048 which has a binary representation of 0000 1000 0000 0000, the sequence length could be as short as 4 depending on the initial state of the accumulator 214. When the initial state of accumulator 214 also is a "round" binary number, +/−REF the initial state and the frequency cointrol signal δφ are all "round", the input to the second accumulator 216 is "round" also, so neither accumulator can cycle through many states.

A simple solution is to adapt the sigma-delta modulator 102 to ensure that either the accumulator 214 powers up with an "odd" binary number, or the accumulator 214 powers up with a value of 0 and then input an "odd" number on line 122 for one cycle. The desired frequency control signal δφ can then be inputted in subsequent cycles as described for normal operation. An appropriate value for this "odd" number has been found to be 17.

Alternatively, the problem of short sequences may be overcome by modifying the sigma-delta modulator 102, namely by providing three or more integrators with two or three feedback paths. One of the feedback paths then uses a reference that is not "round" while the main input reference remains "round".

Figure 5:
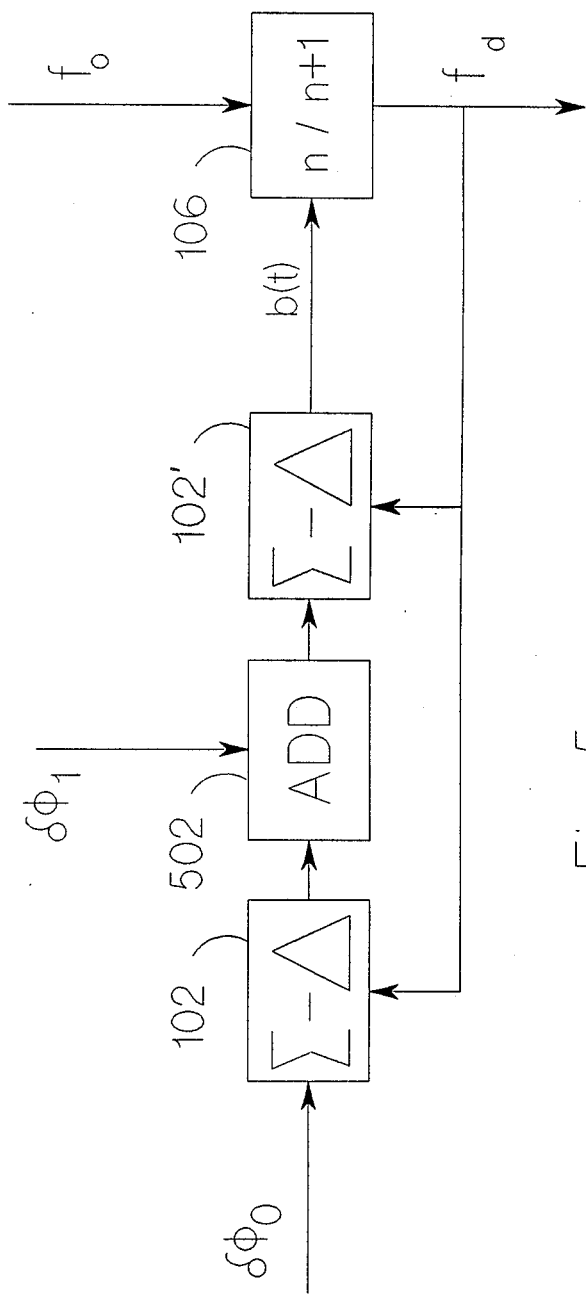
FIG. 5 illustrates a modification applicable to both the indirect synthesizer and the direct frequency synthesizer.

In FIG. 5, which illustrates a modification applicable to both the indirect frequency synthesizer of FIG. 1 and the direct frequency synthesizer of FIG. 4, two sigma-delta modulators 102 and 102', respectively, are connected in cascade by means of an adder 502. The output of sigma-delta modulator 102 is applied to one input of adder 502 and the output of the adder 502 is applied to the second sigma-delta modulator 102'. A second frequency control signal δφ, which is a multi-bit (16-bit) signal, is applied to the input of sigma-delta modulator 102. The output of sigma-delta modulator 102 is a single bit which adder 502 adds to the second least significant bit of a third frequency control signal δφ₁. Second frequency control signal δφ₀ is an offset relative to third frequency control signal δφ1. Conveniently third frequency control signal δφ₁ represents a coarse adjustment to the fractional part of the total division quotient and second frequency control signal δφ₀ represents a fine adjustment to the total division quotient. In essence, the combined signals δφ₁ and δφ₀ effectively correspond to a higher resolution version of frequency control signal δφ of FIG. 1. Since the input signal to sigma-delta modulator 102' is now active, the problem of short sequence lengths does not arise.

Various other modifications and substitutions will be apparent to one skilled in the art. For example, the sigma-delta modulator could be implemented in analog manner, for example as disclosed by Candy in the aforementioned paper. The output of the delay or latch 218 could be multi-bit and the variable modulus divider 106 could be a multi-bit multi-fraction divider.

Another modification concerns the way in which the various additions are performed by adder 202 and accumulators 214 and 216, respectively. Instead of being performed simultaneously, as described, they could be performed serially, for example by using the intermediate clock $f_m$ or the input signal $f_o$ in the embodiment of FIG. 3.

Sigma-delta modulators are available which will produce a multi-bit output and it is envisaged that they could be used with a suitable modification of the programmable divider to respond to such a multi-bit signal.

Although frequency synthesizers embodying the invention are particularly suitable for cellular radio systems, their application is not limited to them. It is envisaged that other applications will include synthesized frequency modulation and mixed analog and digital sigma-delta modulators for providing linearized and frequency-stabilized on-chip voltage controlled oscillators.

For example, the embodiment shown in FIG. 5 could be used for synthesized frequency modulation if third frequency control signal δφ₁ were used for channel selection. Then second frequency control signal δφ₀ would be used to modulate the instantaneous output frequency $f_o$ about the channel frequency.

The embodiment of FIG. 5 could also be modified to serve as a voltage-controlled oscillator by providing an analog sigma-delta modulator 102 and a digital sigma-delta modulator 102'. Third frequency control signal δφ₁ would be a fixed digital signal serving for channel selection. Second frequency control signal δφ₀ would be analog, namely a variable voltage which would control the output frequency. In the context of the embodiment of FIG. 1, the variable output frequency would be $f_o$. In the context of the embodiment of FIG. 4, the variable output frequency would be $f_{od}$. In both cases, improved stability would result from the fact that the output frequency is referred to the input reference signal.

I claim:

1. A frequency synthesizer comprising:
    detector means (110) responsive to a reference signal and a phase control signal ($f_d$) for generating a control signal that varies in dependence upon the phase difference between said reference signal and said phase control signal;
    means (118) responsive to said control signal for generating an output signal ($f_o$) whose frequency varies in dependence upon said control signal;
    means (106) for dividing said output signal ($f_o$) to provide said phase control signal ($f_d$), said dividing means having a control input and being operable to vary its division ratio in dependence upon a ratio control signal (b{t}) applied to said control input; and
    second or higher order sigma-delta modulator means (102) responsive to a frequency control signal (δφ) and to said phase control signal ($f_d$) to provide said ratio control signal (b{t}), the sigma-delta modulator means (102) being arranged to displace any quantization noise in said ratio control signal (b{t}) away from the frequency of said phase control signal ($f_d$) and multiples thereof.

2. A frequency synthesizer as defined in claim 1, wherein said modulator means (102) comprises means (208, 210) for providing a reference signal (REF), summing means (202), for summing said control signal (δφ) and said reference signal (REF), and accumulator means (214, 216) responsive to the sum of said frequency control signal (δφ) and said reference signal (REF) for providing said ratio control signal.

3. A frequency synthesizer as defined in claim 2, wherein said reference providing means serves to provide, selectively, positive (+REF) and negative (−REF) reference signals and said modulator means (102) further comprises selector means (206) responsive to said ratio control signal for applying to said summing means (202) either said positive reference signal (+REF) or said negative reference signal (−REF) in dependence upon said ratio control signal.

4. A frequency synthesizer as defined in claim 2, wherein said accumulator means comprises a plurality of accumulators (214, 216) connected in cascade.

5. A frequency synthesizer as defined in claim 3, wherein said accumulator means comprises a plurality of accumulators (214, 216) connected in cascade.

6. A frequency synthesizer as defined in claim 1, wherein said second or higher order sigma-delta modulator means comprises a plurality of second or higher order sigma-delta modulators connected in cascade, by means of an adder means (502), one of said modulators (102) being controlled by a second frequency control signal $\delta\phi_0$ and having its output connected to one input of said second summing means, the other of said modulators (102') being controlled by the output of said adder (502) and having its output connected to said divider (106), said adder (502) having a third frequency control signal ($\delta\phi_1$) applied to a second input thereof.

7. A frequency synthesizer as defined in claim 1, wherein said divider means comprises a first divider (312) for dividing said output signal by either of two ratios to provide an intermediate signal ($f_m$), second divider means (316) for dividing said intermediate signal ($f_m$) by a third ratio to provide said phase control signal ($f_d$), and control means (302, 318) clocked by the intermediate signal ($f_m$) and responsive to the instantaneous state of said second divider means (316), a second frequency control signal ($I_d$), and the output from the sigma-delta modulator means (102), for controlling the division ratio of said first divider (312) to select either said first ratio or said second ratio.

8. A frequency synthesizer as defined in claim 7, comprising second delay means (306) for delaying the output of said sigma-delta modulator means (102), said control means comprising selector means (302) for applying either said second frequency control signal ($f_d$), the instantaneous output of said sigma-delta modulator means (102) or the output of said second delay means (306) to control said first divider (312).

9. A frequency synthesizer as defined in claim 1, wherein said detector means comprises a phase detector.

10. A frequency synthesizer as defined in claim 1, wherein said means for generating said output signal comprises an oscillator.

11. A frequency synthesizer comprising variable modulus divider means (106) for dividing a reference signal ($f_r$) having a predetermined frequency to provide an output signal ($f_{od}$) of a desired frequency, the ratio of such division being variable in dependence upon a ratio control signal b(t), and second or higher order sigma-delta modulator means (102) responsive to a control signal ($\delta\phi$) and to said output signal ($f_{od}$) from said divider means (106) for supplying said ratio control signal b(t), the arrangement being such that any quantization noise in said ratio control signal b(t) is displaced away from the frequency of said output signal ($f_{od}$) and multiples thereof.

12. A frequency synthesizer as defined in claim 11, wherein said second or higher order sigma-delta modulator means (102) comprises means for providing a reference signal (REF), summing means (202) for summing said control signal ($\delta\phi$) and said reference signal (REF), and accumulator means (214, 216) responsive to the sum of said control signal ($\delta\phi$) and said reference signal (REF) for providing said ratio control signal.

13. A frequency synthesizer as defined in claim 12, wherein said reference providing means serves to provide, selectively, positive (+REF) and negative (−REF) reference signals and said modulator means (102) further comprises selector means (206) responsive to said ratio control signal for applying to said summing means (202) either said positive reference signal (+REF) or said negative reference signal (−REF) in dependence upon said ratio control signal.

14. A frequency synthesizer as defined in claim 12, wherein said accumulator means comprises a plurality of accumulators (214, 216) connected in cascade.

15. A frequency synthesizer as defined in claim 13, wherein said accumulator means comprises a plurality of accumulators (214, 216) connected in cascade.

16. A frequency synthesizer as defined in claim 11, wherein said sigma-delta modulator means comprises a plurality of sigma-delta modulators connected in cascade by means of an adder (502), one of said modulators (102) being controlled by a second frequency control signal $\delta\phi_0$ and having its output connected to one input of said adder (502), the other of said modulators (102') being controlled by the output of said adder (502) and having its output connected to said divider (106), said adder having a third frequency control signal ($\delta\phi_1$) applied to a second input thereof.

17. A frequency synthesizer as defined in claim 11, wherein said divider means comprises a first divider (312) for dividing said output signal by either of two ratios to provide an intermediate signal ($f_m$), second divider means (316) for dividing said intermediate signal ($f_m$) by a third ratio to provide said phase control signal ($f_d$), and control means (302, 318) clocked by the intermediate signal ($f_m$) and responsive to the instantaneous state of said second divider means (316), a second frequency control signal ($I_d$), and the output from the sigma-delta modulator means (102), for controlling the division ratio of said first divider (312) to select either said first ratio or said second ratio.

18. A frequency synthesizer as defined in claim 17, comprising second delay means (306) for delaying the output of said sigma-delta modulator means (102), said control means comprising selector means (302) for applying either said second frequency control signal ($f_d$), the instantaneous output of said sigma-delta modulator means (102) or the output of said second delay means (306) to control said first divider (312).

19. A frequency synthesizer as defined in claim 11, wherein said detector means comprises a phase detector.

20. A frequency synthesizer as defined in claim 11, wherein said means for generating said output signal comprises an oscillator.

21. A frequency synthesizer as defined in claim 12, further comprising means for varying the amplitude of said reference signal (REF) in dependence upon said ratio control signal.

* * * * *